United States Patent [19]

Goldstein et al.

[11] Patent Number: 4,670,662

[45] Date of Patent: Jun. 2, 1987

[54] PULSE SYNTHESIZING NETWORK AND METHOD

[75] Inventors: Yeshayahu S. A. Goldstein, Gaithersburg, Md.; Niels K. Winsor, Alexandria, Va.

[73] Assignee: GT-Devices, Alexandria, Va.

[21] Appl. No.: 832,586

[22] Filed: Feb. 24, 1986

[51] Int. Cl.$^4$ .............................................. H03K 3/45
[52] U.S. Cl. .................................... 307/106; 307/419; 328/65
[58] Field of Search ........................ 307/106, 419, 421; 328/59, 65–67; 323/328, 329, 345, 346

[56] References Cited

U.S. PATENT DOCUMENTS

| | | | |
|---|---|---|---|
| 3,198,956 | 8/1965 | James .................................. | 307/419 |
| 3,316,419 | 4/1967 | Coker .................................. | 307/419 |
| 3,512,007 | 5/1970 | Fitz et al. ............................ | 307/419 |
| 4,482,816 | 11/1984 | Richardson et al. ................ | 328/65 |
| 4,612,455 | 9/1986 | Weiner et al. ....................... | 307/106 |

FOREIGN PATENT DOCUMENTS

| | | |
|---|---|---|
| 1488941 | 5/1972 | Fed. Rep. of Germany . |
| 445131 | 9/1974 | U.S.S.R. ............................... 328/65 |
| 824412 | 4/1981 | U.S.S.R. ............................... 307/419 |

OTHER PUBLICATIONS

*IBM Technical Disclosure Bulletin*, vol. 4, No. 3, 8/61, p. 87, D. R. Daykin.
"Pulsed Superconductive Inductive Storage Systems", O. K. Mawardi and Ho K. Chung, Case Western Reserve University Publication IID 5-1.

*Primary Examiner*—Vit W. Miska
*Attorney, Agent, or Firm*—Lowe, Price, LeBlanc, Becker & Shur

[57] ABSTRACT

A pulse forming network, responsive to a DC power supply, supplies predetermined current waveforms to a load in response to commands from a programmed source. Plural inductors are connected to switches responsive to commands from the programmed source. The switches are controlled to couple the inductors to the DC source to charge the inductors to a predetermined current level that is maintained substantially constant. The predetermined current level in each inductor is supplied to the load by switches controlled by the programmed source so that during successive intervals the predetermined constant current levels from differing numbers of the inductors flow from the inductors to the load. The inductance of each inductor, the load impedance and the duration current is supplied to the load by the inductors are such that the predetermined current level supplied by each inductor to the load is maintained relatively constant.

29 Claims, 18 Drawing Figures

PULSE SYNTHESIZING NETWORK AND METHOD

TECHNICAL FIELD

The present invention relates generally to a method of and apparatus for supplying predetermined current waveforms to a load in response to commands from a programmed source, and more particularly to such a method and apparatus wherein a plurality of charged inductors are connected to the load during successive time intervals so predetermined constant current levels flow from differing numbers of the inductors to the load.

BACKGROUND ART

Pulse forming networks have been extensively developed and used to supply currents having predetermined voltage and current waveforms to a load. One type of pulse forming network is similar to delay lines having series inductance and shunt capacitance, formed either by distributed or discrete components. Generally, the waveforms derived from these prior art pulse forming networks are fixed, and depend on the configuration of the delay line. In addition, for certain applications, it is desirable to use inductors as energy storage components, rather than capacitors. This is because inductors are high energy density storage devices, typically capable of storing at least 100 times more energy, in terms of volume and weight, than capacitors.

The advantages of using inductors in pulse forming networks have been previously realized, for example, in Patentschrift No. 1 488 941, Republic of Germany, filed May 31, 1966, granted Nov. 16, 1972. The pulse forming network of this reference includes a DC power supply and plural inductors, connected in series with each other and the supply. After the supply has charged the inductors with a predetermined current, the series connections between the inductors and the supply are interrupted, and the inductors are simultaneously connected in parallel to each other and the load. Thereby, the charging current initially supplied to each of the inductors is multiplied in the load, by the number of inductors. The parallel connections, in one embodiment, are established by voltage responsive switches, formed as fusable elements that are basically destroyed after each pulse is supplied by the inductors to the load. This embodiment of the device, is described as being reduced to practice in a report by W. Koch, identified as BMwF-FB K 67-35, dated Apr. 1967. This is apparently in contrast to a second embodiment of the German patent, wherein electro-mechanical switches are connected between the inductors and load during the discharge cycle. In any event, the pulse forming networks capable of delivering high current levels to a load, as disclosed in German Patentschrift No. 1 488 941, are incapable of being programmed to provide current waveforms having different shapes, controlled by the opening and closing of switches at different times during a discharge cycle.

It is, accordingly, an object of the present invention to provide a new and improved apparatus for and method of supplying a load with pulses having predetermined current waveforms in response to commands from a programmed source.

A further object of the invention is to provide a new and improved high density energy storage device capable of supplying pulses having predetermined current waveforms to a load in response to commmands derived at different times from a programmed source.

A further object of the invention is to provide a new and improved pulse forming network and method of supplying current waveforms having a predetermined shape to a load such that individual inductors and switches connected thereto need only carry a fraction of the full current supplied to a load.

An additional object of the invention is to provide a new and improved pulse forming network and method for supplying predetermined current waveforms to a load by utilizing inductive energy storage devices for supplying the load with currents in excess of the current applied by a DC power supply to any of the individual storage devices.

DISCLOSURE OF INVENTION

In accordance with the present invention, a pulse forming network and method for supplying predetermined current waveforms to a load responds to commands from a programmed controller and includes plural inductors $L_1, L_2 \ldots L_n$, where n is an integer greater than 1. A switch means responds to commands from the programmed controller to couple inductor $L_k$ to a DC power supply source so that inductor $L_k$ is charged by the supply to a predetermined current level that is maintained substantially constant, where k is selectively every value between 1 and n. The switch means also supplies approximately the predetermined current level in each inductor to the load so that during successive intervals the predetermined approximately constant current levels from differing numbers of the inductors flow from the inductors to the load. The inductance of each inductor, the impedance of the load, and the durations of currents which are supplied to the load by the inductors are such that the predetermined current level supplied by each inductor to the load is maintained relatively constant. The current level for inductor $L_k$ is considered to be maintained approximately constant if it is in the range from 1.0 to about 0.7 of the magnitude of the current to which inductor $L_k$ is charged by the DC source. By maintaining the current in each inductor in the 1.0 to 0.7 range of the current supplied by the DC source to the inductor, the rate of energy transfer from the inductor to the load is in the range of 1.0 to about 0.5 of the rate of energy transfer to the inductor from the DC power supply. This is because the rate of energy transfer by an inductor is proportional to the square of the current supplied to the load. Thus, if the current supplied by a DC source to the load is $I_1$, and the current supplied by the inductor to the load decreases exponentially from $I_1$ to $0.7 I_1$, the energy transferred by the inductor to the load equals $[1-(0.7)^2]=0.51$ of the energy supplied by the DC source to the inductor.

Preferably, the inductors are magnetically coupled together, by being mounted on a common toroidal core. By magnetically coupling the several inductors together, energy is most efficiently stored in the inductors. This is because the magnetic flux which passes through one inductor also passes through all the other inductors, whereby the several inductors together provide a complete energy storage device. The energy which can be stored in a number "n" of mutually coupled identical inductors is a factor of $n^2$ larger than the energy which can be stored in one of them without the others.

The coupling is greatest for inductors mounted on a common toroidal core made of high magnetic permeability material, e.g. iron. However, there is also fairly high magnetic coupling for toroids made of other materials having relatively low magnetic permeability, but which are usually much lighter in weight than magnetic toroids. While magnetic coupling of the inductors is desirable from an efficiency standpoint, there is a safety advantage to having the several inductors magnetically decoupled from each other. If one of the inductors in a magnetically coupled array fails, much of the energy of the failed inductor is transferred to the other inductors, to increase the current flow and stresses in the other inductors. If the several inductors are not coupled together, the current transfer and increased stresses do not occur.

By magnetically coupling the inductors to each other, it is possible to connect only one of the inductors directly to the DC power supply, and the other inductors can be charged by magnetic transformer action. By charging the other inductors through the magnetic transformer action, rather than by direct connections, the need to disconnect the charged inductors from the DC energy source while the load is being driven is obviated. Hence, the magnetic transformer action can simplify switching and/or increase the flexibility of the pulse forming network in matching the impedance of the inductors to the power supply impedance.

A problem in supplying current from the charged inductors to the load by way of the switching means is that opening and closing of switches carrying high currents is likely to cause arcing and result in dissipation of energy, as well as deleterious effects on the switching elements. Arcing occurs in circuits including inductors because of the ability of the voltage across an inductor to change instantaneously (since $V_L$ the voltage across the inductor, is equal to $L(dI/dt)$), and the tendency of current flowing through an inductor to remain constant $$\left( \text{since } I = \frac{1}{L} \int V_L dt \right).$$

To avoid this problem, the switch means includes a separate switch element $S_k$ connected in series with each individual inductor $L_k$. Each separate switch element $S_k$ is changed between open and closed states by one of the commands as current is initially supplied by the individual $L_k$ to the load. Each separate switch $S_k$ is open circuited as current is initially supplied by each individual inductor $L_k$ to the load. In one embodiment, each separate switch element $S_k$ includes a path that is opened and closed in response to a bilevel signal derived in response to one of the commands and applied to a switch control terminal. The path is connected in series with each individual inductor $L_k$. The switch means further includes first and second switches $S_{1k}$ and $S_{2k}$ connected across each open circuited switch element $S_k$ to supply current from the individual inductor $L_k$ to the load. In a second embodiment, the first and second switches $S_{1k}$ and $S_{2k}$ are connected across each individual inductor $L_k$ to supply current from the individual inductor $L_k$ to the load. In addition, a further separate switch $S_{sk}$ is connected across, i.e., in parallel with, the series combination of inductor $L_k$ and switch element $S_k$. Each further separate switch $S_{sk}$ is closed between the time the individual inductor $L_k$ is charged until switch element $S_k$ is open and the first and second switches $S_{1k}$ and $S_{2k}$ are closed to supply current to the load. In this second embodiment, switch $S_{1k}$ has first and second electrodes in series between a first terminal of switch element $S_k$ associated therewith and a first load terminal, while switch $S_{2k}$ has first and second electrodes connected in series with a second terminal of switch element $S_k$ and a second terminal of the load.

To protect the DC power supply and to help minimize transients, as well as to provide time for recovery of the power supply between charging cycles, the power supply is isolated from the inductors while the inductors are being discharged through the load. Protection of the load from the power supply is also provided by decoupling the load from the inductors, while the inductors are being charged.

While we realize that resonant charging or inverter circuits have previously stored energy in an inductor or several inductors and have employed controlled switches for transferring energy from the inductor or inductors to a load, as disclosed on pages 212-215 of Bird et al, "An Introduction To Power Electronics" (New York, John Wiley and Sons, 1983), the prior art circuitry has typically been intended to produce alternating current from DC sources. This prior art is not relevant to the present invention because no impedance change or programming is involved in the prior art. This prior art device uses circuit elements to cause energy to flow into or out of plural inductors, at fixed points in an AC cycle input or output.

The above and still further objects, features and advantages of the present invention will become apparent upon consideration of the following detailed description of several specific embodiments thereof, especially when taken in conjunction with the accompanying drawings.

BEST MODE FOR CARRYING OUT THE INVENTION

Figure 1:
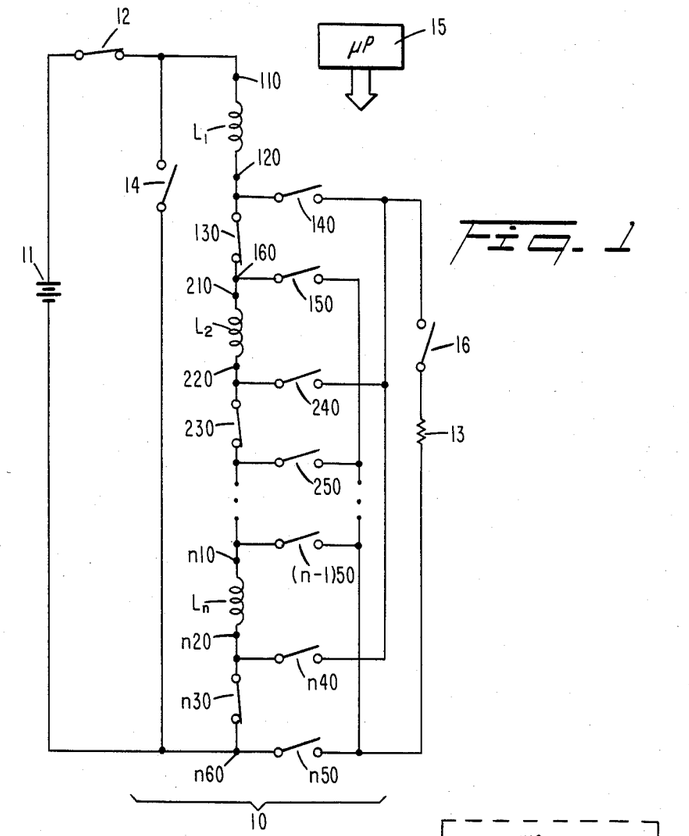
FIG. 1 is a circuit diagram of a first generalized embodiment of the invention.

Reference is now made to FIG. 1 of the drawing wherein DC power supply 11 is selectively connected to load 13 (assumed to be resistive for ease of description) via a pulse forming network 10 having switches controlled by a programmed source in microprocessor 15. Network 10 includes series switch 12 which is selectively closed to charge inductors $L_1, L_2 \ldots L_n$, where n is an integer greater than 1, and usually on the order of 10. Inductors $L_1, L_2 \ldots L_n$ are selectively connected in series to be charged by DC source 11, so that each of the inductors is supplied with the same current.

Figure 1A:
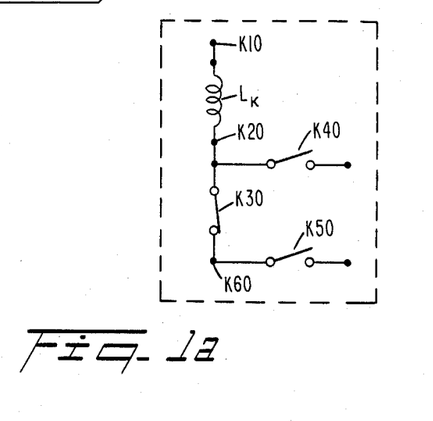
FIG. 1a is a circuit diagram of one module or section of the device illustrated in FIG. 1.

Typically, each of inductors $L_k$ has the same value and is included in a separate module (Fig. 1a), where k is successively every integer from 1 to n. The voltage across each of inductors $L_k$ is the same when the inductors have been charged by source 11, and each of the inductors stores the same amount of energy. Each of inductors $L_k$ includes opposite end terminals k10 and k20, whereby, for example, inductor $L_2$ includes end terminals 210 and 220. Associated with and connected in series with each inductor $L_k$ is switch k30, whereby switch 230 is connected in series with and is associated with inductor $L_2$. Connected to opposed terminals of each of switches k30 are switches k40 and k50 which are selectively closed when switch k30 is opened; when switches k40 and k50 are closed current from inductor $L_k$ flows through them to load impedance 13. One terminal of each of switches k40 is connected to terminal k20 of inductor $L_k$. Thus, one terminal of each of switches 230 and 240 is connected to terminal 220 of inductor $L_2$, and the remaining terminal of switch 230 is connected to one terminal of switch 250. Terminal k60, common to one of the electrodes of switches k30 and k50, is connected to terminal (k+1)10 of inductor $L_{(k+1)}$. Thus, terminal 160 is connected to terminals of switches 130 and 150 as well as to terminal 210 of inductor $L_2$.

Inductors $L_k$ are connected in series with each other and with DC supply 11 by microprocessor 15 commanding switches k30 to be initially closed, as well as by connections of terminal 110 of inductor $L_1$ to the positive electrode of DC supply 11 by switch 12 and of terminal n60 to the negative electrode of supply 11. The entire series circuit including inductors $L_1, L_2 \ldots L_n$ is selectively shunted by microprocessor 15 commanding closure of switches 14 and 16, respectively connected between terminals 110 and n60 and in series with load 13. Switches k30, k40 and k50 are opened and closed by commands from microprocessor 15 to cause the current circulating in inductor $L_k$ to be supplied to load 13. Because the same current is initially supplied to all of inductors $L_k$ and this current is maintained approximately constant during operation of switches k30, k40 and k50, the current flowing through load 13 changes in discrete predetermined levels in response to activation of the switches associated with a particular inductor $L_k$.

Control of switches 12, 14, 16 and k30 is in response to command signals derived by microprocessor 15, including a programmed memory that commands switches 12, 14, 16 and k30 to open and close in a predetermined order to provide desired step synthesized current changes across load 13. The step changes in the current supplied to load 13 are accompanied by step voltage changes across the load. Switches k40 and k50 are voltage responsive devices, e.g., diodes, which conduct in response to the polarity and magnitude of the voltage between series electrodes thereof. Hence, changes in the states of switches k40 and k50 occur slightly after state changes of switch k30.

In operation, initially microprocessor 15 controls switches 12, 14, 16 and k30, so that inductors $L_k$ are charged with the same current, $I_1$, and load 13 is decoupled from source 11. During the charging operation, switches 12 and k30 are closed while switches 14, 16, k40 and k50 are open circuited so that load 13 is isolated from inductors $L_k$ and the inductors are charged by DC current from source 11. After inductors $L_k$ have been charged to the desired current level, $I_1$, microprocessor 15 opens switch 12 and closes switch 14, without initially changing any of switches k30 from the closed to open state. Thereby, a circulating current having the same magnitude $I_1$ as the charging current flows through inductors $L_k$ and switch 14. If it is assumed that inductors $L_k$ and the connections thereto, including switches k30 and 14, have virtually no resistance, current $I_1$ is maintained and circulates continuously in the path including closed switch 14.

Figure 2A:
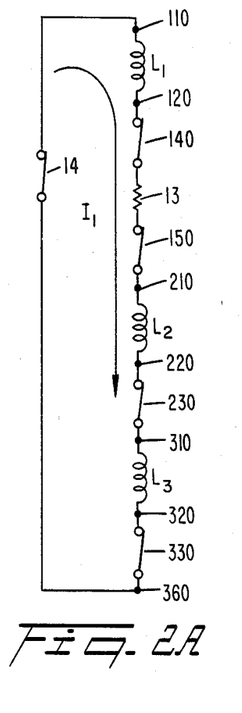
FIGS. 2a-2c are circuit diagrams for three different operating phases of a specific embodiment of the circuit illustrated in FIG. 1, wherein three inductors are included.
Figure 2B:
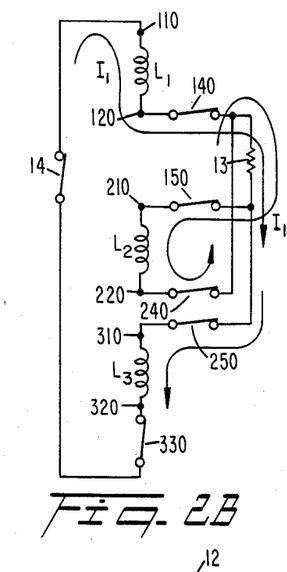
Figure 2C:
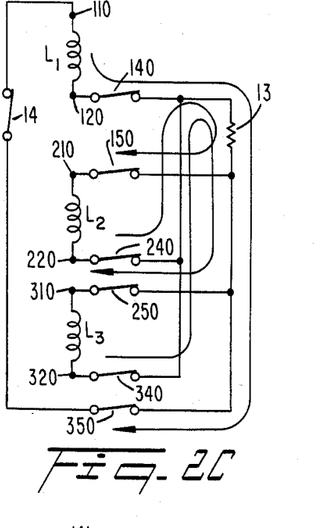

To describe the manner in which a desired waveform is synthesized by currents in inductors $L_k$ flowing through load 13, consider the example of FIGS. 2a–2c, wherein n=3. In FIGS. 2a, 2b and 2c the circuit of FIG. 1 is configured so that currents $I_1$, $2I_1$ and $3I_1$ respectively flow through load impedance 13 during successive intervals $t_1$, $t_2$ and $t_3$. The currents $I_1$, $2I_1$ and $3I_1$ are assumed to be approximately constant by proper selection of the closing intervals for switches k40, k50, as well as the values of inductors $L_k$ and load 13. In particular, the time intervals $t_1$, $t_2$ and $t_3$ during which currents $I_1$, $2I_1$ and $3I_1$ respectively flow are related to the inductances of inductors $L_1$, $L_2$ and $L_3$ and the resistances $R_{L1}$, $R_{L2}$ and $R_{L3}$ of inductors $L_1$, $L_2$ and $L_3$ and the resistive impedance of load 13, $Z_L$, in accordance with $$t_1 + t_2 + t_3 << \frac{(L_1 + L_2 + L_3)}{R_{L1} + R_{L2} + R_{L3} + 3Z_L}.$$

The current initially supplied to load 13 during any of the phases illustrated in FIGS. 2a–2c is considered to be approximately constant if it drops less than 30% during the interval $t_1+t_2+t_3$, i.e., from $I_1$ to $0.7I_1$.

Considering FIGS. 2a–2c in detail, current $I_1$ flows through each of inductors $L_1$, $L_2$ and $L_3$ and load 13 by virtue of switch 130 opening, causing switches 140 and 150 to close, while switches 230 and 330 remain closed. Because switches 230 and 330 remain closed, switches 240, 250, 340 and 350 remain open. Thereby, current $I_1$ in each of inductors $L_1$, $L_2$ and $L_3$ flows in a closed loop including load 13 and closed switch 14. There is, accordingly, a voltage drop $I_1Z_L$, across load 13 during the first phase of operation illustrated in FIG. 2a.

Next assume that switch 230 is open circuited, to cause switches 240 and 250 to close, while switch 130 remains open and switches 140 and 150 remain closed. Thereby, as illustrated in FIG. 2b, a first branch circuit is provided in which inductors $L_1$ and $L_2$ are in series with each other and load 13, causing current $I_1$ to flow through load 13. Simultaneously, a second branch circuit including inductor $L_2$ feeds a second current having a value $I_1$ into load 13. The direction of current flow from inductor $L_2$ into load 13 is the same as the direction of current flow from series inductors $L_1$ and $L_3$ into the load. This is by virtue of the manner in which terminals 210 and 220 of inductor $L_2$ are connected by switches 150 and 240 to load 13, as well as by virtue of the series connection of switch 250 to terminal 310 of inductor $L_3$. Because there are now two branch circuits, each feeding a current $I_1$ to load 13, the total load current is $2I_1$, and the voltage across load 13 increases to $2I_1Z_L$.

During the third phase, the current through load 13 increases to $3I_1$ and the voltage across the load increases to $3I_1Z_L$. This result is achieved by connecting inductors $L_1$, $L_2$ and $L_3$ in parallel with load 13, as illustrated in FIG. 2c. In particular, switch 330 is open circuited, causing switches 340 and 350 to close, while the connections described for switches 130, 140, 150, 230, 240 and 250 remain as described in connection with FIG. 2b.

Hence, the program of microprocessor 15 controls the switches of the network illustrated in FIGS. 2a–2c to cause the voltage and current of load 13 to increase in three discrete steps so that the current values are zero, $I_1$, $2I_1$ and $3I_1$. It is to be understood that switches k30, k40 and k50 associated with inductors $L_k$ can be opened and closed in any desired sequence by the program of microprocessor 15 to provide a desired waveform. The waveform need not be in successive steps, but can change by any multiple of $I_1$. In other words, it is possible, with the present invention, to synthesize a current through load 13 that changes from zero to $3I_1$, to $I_1$, and to $2I_1$, and to return to zero, by appropriate sequencing of switches 130, 230 and 330. The lengths of time switches 130, 230 and 330 are opened and closed, as will as the sequencing of the switches, control the shape of the waveform developed across load 13.

It is important, to prevent sneak currents, for switch k30 to be open before switches k40 and k50 are closed. It is also important to prevent arcing and to maintain the constant current to close switches k40 and k50 after switch k30 has been open before the voltage across switch k30 can exceed the voltage across load 13. If switches k40 and k50 were closed before opening of switch k30, switches k40 and k50 may transfer current from load 13 to switch k30, with deleterious effects on the operation of switch k30 because the maximum current rating thereof is likely to be exceeded. While switches k40, k50 and 14 are closed, they should have as small a resistance as possible. However, opening of switches k30 does not require a complete open circuit; in fact, opening of switch k30 is construed as a substantial reduction in the current flowing through switch k30.

For certain applications, it is desired to connect switch 16 in series with load 13. Switch 16 is maintained in an open condition while switch 12 is closed and switch 14 is open, to charge inductors $L_k$ with current from DC supply 11. The switch in series with load 13 permits switches k40 and k50 to float, to simplify controlling the breakdown thereof. Switches 12 and 14 enable power supply 11 to be removed from the circuit and to be protected from the voltages which are developed across inductors $L_k$ when they are switched to load 13. In addition, disconnecting DC supply 11 from inductors $L_k$ enables the supply to recover after it has charged the inductors.

There are practical limits to the number n of inductors which can be used in the circuit of FIG. 1. The number of inductors L must be large enough to provide useful current multiplication beyond the current derived from DC power supply 11 for high power applications. However, the number of inductors L should not be so large that the inductors and circuitry associated therewith dissipate too much internal energy due, for example, to losses in the inductors, connecting wires therefor, and magnetic cores or other components which might be associated with the inductors. The limit on the number of inductors depends on the energy stored in each inductor, the rate of energy dissipation due to losses in each inductor, the switches and wires associated with the inductor, and the desired output power supplied to load 13.

Consider the system of FIG. 1 wherein there are n inductors, each having the same inductive value L; each inductor stores energy $E_m$ when charged by DC supply 11. Further assume that energy is dissipated in each of inductors $L_k$ at a rate $P_m$ when the inductor is fully charged and that it is desired to transfer all of the energy stored in inductors $L_k$ to load 13 at a rate $P_L$. The circuit of FIG. 1 efficiently stores energy from DC supply 11 if:

$$\frac{N \cdot E_m}{P_L} << \frac{E_m}{P_m}$$

that is if $N \cdot P_m << P_L$. Thus, the time required for load 13 to consume the total energy stored in all of inductors $L_k$ must be much shorter than the time required for the individual inductors to dissipate the energy stored therein. If the number of inductors n is large, this inequality is a stringent requirement for the internal resistance of switches 14, 16, k20, k30, k40, k50 to be small.

Figure 3:
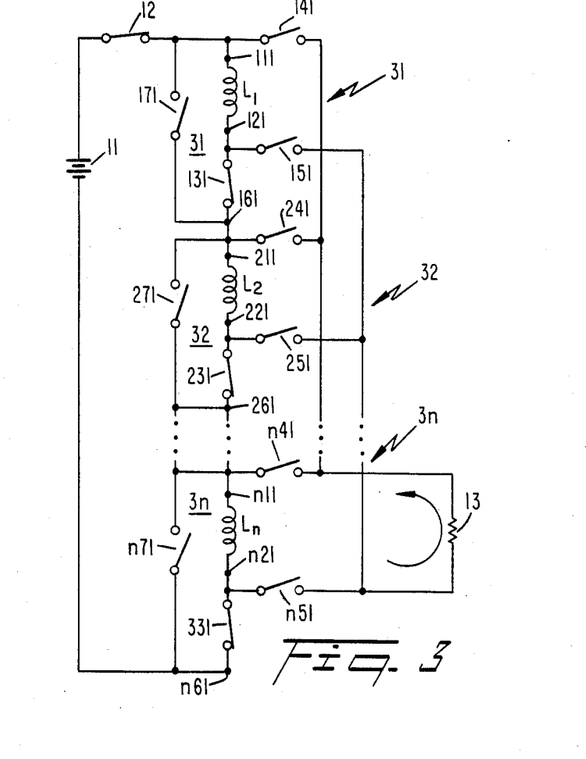
FIG. 3 is a circuit diagram of a second generalized embodiment of the invention.
Figure 3A:
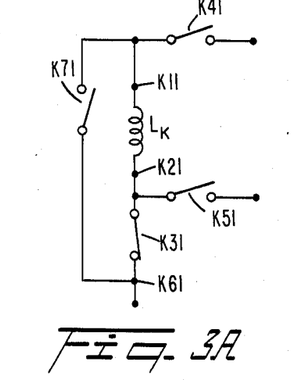
FIG. 3a is a circuit diagram of one module or section of the device illustrated in FIG. 3.

Reference is now made to FIGS. 3 and 3a of the drawing, a circuit diagram of a second embodiment of the invention wherein the circulating current for each inductor is supplied to load 13 by each individual inductor, rather than by one or some of the inductors. Thereby, greater control of the circulating current supplied to load 13 is attained with the embodiment of FIGS. 3 and 3a than with the embodiment of FIGS. 1 and 1a. The result is attained because in the system of FIGS. 3 and 3a, the switches which transfer current to the load are connected across the inductors, instead of across the switches which are open circuited to feed the loop current to the load. Because practical switches have finite, non-zero impedances, this arrangement decreases the dissipation of energy supplied by an inductive energy storage device to the load. Thereby, the current supplied by each inductor to the load has a tendency to remain at the initial value for a greater length of time and to transfer energy more efficiently to the load.

Referring now more particularly to FIGS. 3 and 3a. DC power supply 11 is connected in series with switch 12 and n modules 31, 32 . . . 3n, n>1. As illustrated in FIG. 3a, a typical module 3k includes inductor $L_k$ having terminals k11 and k21, respectively connected to normally open circuited, controlled switches k41 and k51. Terminal k21 is connected to electrodes of switch k41 and normally closed switch k31. The other electrode of switch k31 is connected to terminal k61 which is connected to terminal (k+1)11 of inductor $L_{(k+1)}$. The path between terminals k11 and k61 is selectively short circuited by normally open switch k71. Switches k31, k41, k51 and k71 are selectively opened and closed in response to external command signals from microprocessor 15 (FIG. 1).

Thus, considering module 32 of FIG. 3, inductor $L_2$ includes terminals 211 and 221, respectively connected to one electrode of each of switches 241 and 251. Terminal 221 of inductor $L_2$ is connected to one electrode of switch 231, having a second terminal connected to terminal 261, in turn connected to terminal 311 of inductor $L_3$. Terminals 211 and 261 are connected to opposite electrodes of switch 271.

The electrodes of switches k41 and k51 opposite from the electrodes connected to terminals k11 and k21 of inductor $L_k$ are connected to opposite terminals of load 13. Thus, load 13 is selectively connected in parallel with inductors $L_1, L_2 \ldots L_n$ to be responsive to the circulating current flowing in each of inductors $L_k$.

Initially, switch 12 and switches k31 are closed while switches k41, k51 and k71 are open. Thereby, DC supply 11 charges inductors $L_k$ with the same current $I_1$. When inductors $L_k$ have been appropriately charged, switches k71 are closed and switch 12 is opened. Simultaneously, switches k31, k41 and k51 remain in the initial conditions thereof, i.e., switch k31 is closed while switches k41 and k51 are open.

Figure 4A:
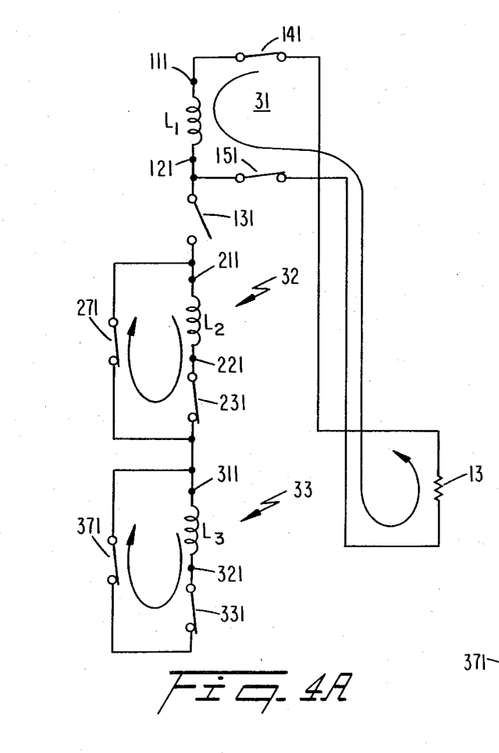
FIGS. 4a-4c are circuit diagrams for the operating phases of a specific embodiment of the circuit illustrated in FIG. 3, wherein three inductors are included.

To provide load 13 with three equal amplitude current steps ($I_1$, $2I_1$ and $3I_1$), the circuit of FIG. 3 is arranged so n=3, whereby modules 31, 32 and 33 are included. In such an instance switches 131-331, 141-341, 151-351, and 171-371 are provided and sequenced to establish the connections illustrated in FIGS. 4a-4c. To provide the first step, microprocessor 15 activates the switches to the conditions illustrated in FIG. 4a, causing the circulating current in inductor $L_1$ to be transferred from the short circuit including switches 131 and 171 to load 13. To this end, switches 131 and 171 are open circuited and switches 141 and 151 are closed. The circulating current $I_1$ of inductor $L_1$ previously flowing through switches 131 and 171 is thereby transferred to flow through load 13. The circulating current in inductor $L_1$ and load 13 is isolated from the circulating currents in inductors $L_2$ and $L_3$ because switch 131 is open circuited. Thus, the current $I_1$ which initially charged inductor $L_1$ is transferred to load 13, while separate currents, each having a value $I_1$, continue to flow in inductors $L_2$ and $L_3$ and the switches 231, 271 and 331, 371 respectively associated therewith.

Figure 4B:
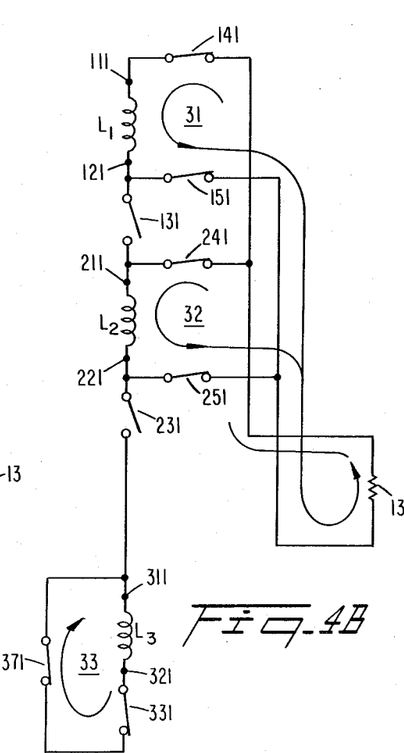

Now consider the operations which cause a current magnitude $2I_1$ to flow through load 13, by referring to FIG. 4b. The connections between module 31 and load 13 in FIG. 4b are the same as FIG. 4a, whereby inductor $L_1$ supplies a current having a magnitude $I_1$ to the load. In addition, module 32 is connected to load 13 to supply a current magnitude $I_1$ to the load, whereby the total load current magnitude is $2I_1$. To these ends, microprocessor 15 activates switches 231, 241, 251 and 271 so switches 231 and 271 are simultaneously open circuited, followed immediately by closure of switches 241 and 251. Thereby current having a magnitude $I_1$ previously flowing in inductor $L_2$ and switches 231 and 271 is transferred to load 13 by way of switches 251 and 241. The connections between terminals 211 and 221 and the terminals of load 13 are such that the polarities of the currents flowing from inductors $L_1$ and $L_2$ through load 13 are the same, as indicated by the arrows in FIG. 4b. Current having a magnitude $I_1$ still circulates through inductor $L_3$, by way of the short circuit established by switches 331 and 371 being closed. This circulating current is positively decoupled from the currents flowing through load 13, by virtue of switch 231 being open circuited. The currents flowing from inductors $L_1$ and $L_2$ through load 13 are also decoupled from each other, except while they are flowing through the load, by virtue of switch 131 being open.

Figure 4C:
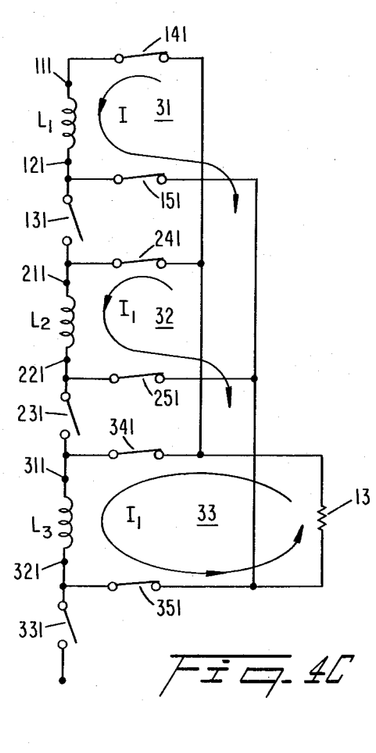

Consider now the connections necessary to cause a current of magnitude $3I_1$ to flow through load 13, as illustrated in FIG. 4c. Microprocessor 15 causes modules 31 and 32 to remain in the same conditions illustrated in FIG. 4b, but module 33 is now switched from the position illustrated in FIG. 4b, to the position illustrated in FIG. 4c, to cause an additional current magnitude $I_1$ to flow through load 13, whereby the total load current is $3I_1$.

In particular, microprocessor 15 opens switches 331 and 337, and then immediately thereafter closes switches 341 and 351. A path for positive current $I_1$ flowing out of inductor $L_3$ through terminal 321 to load 13 by way of switch 251 is thereby provided. The current $I_1$ flowing out of load 13 returns to terminal 311 of inductor $L_3$ by way of switch 341. Simultaneously, the previously described current paths are maintained from inductors $L_1$ and $L_2$ through load 13, whereby the current through load 13 is $3I_1$, and the voltage across load 13 is $3I_1Z_L$, where $Z_L$ is the magnitude of the impedance of load 13. To prevent possible sneak currents, switches 131, 231 and 331 are in an open condition, and switches 141, 151, 241, 251, 341, and 351 are polarized so that switches 151, 251 and 351 cause positive current to flow into the bottom terminal (as illustrated in FIG. 4c), of load 13, while switches 141, 241, and 341 are polarized so that unidirectional current flows from the top terminal of load 13 into inductor terminals 111, 211, and 311.

In many instances, it is desired to supply currents having different incremental values to load 13, so that all currents supplied to the load are not an integral multiple of the current initially supplied by DC power supply 11 to the inductors. Such a result is achieved, in accordance with one aspect of the present invention, by connecting different numbers of inductors in several parallel branches across DC power supply 11. Preferably, all of the inductors have the same inductance value so that when the different inductors are connected to the load, the time constants of the circuits supplying current to the load are not a function of which inductors are in circuit with the load. Also, all of the inductors are connected in parallel to the load, on a one-by-one basis, to maximize efficiency and simplify switching, as well as to minimize arcing.

Figure 6:
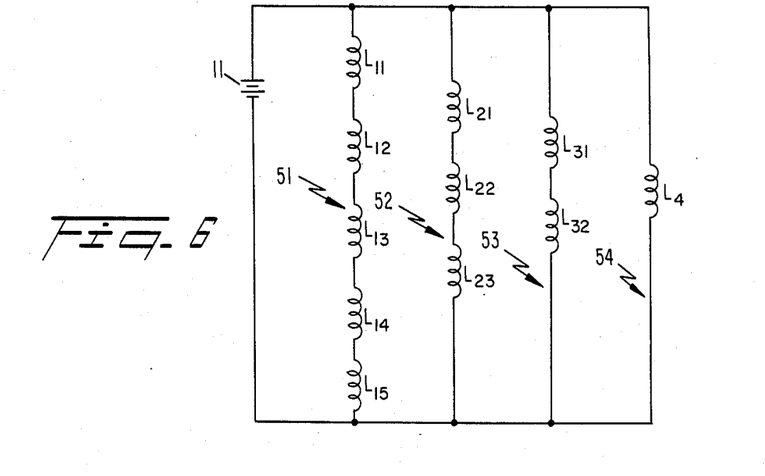
FIG. 6 is a circuit diagram of apparatus of the type illustrated in FIG. 5, wherein several parallel branches, including differing number of inductors in the several branches, are connected by some of the switches of FIG. 5 to be charged by a DC power source.

In FIG. 6 is illustrated a specific circuit including four branches 51, 52, 53 and 54, all connected in parallel with each other and to DC power supply source 11 to supply load 13 with different incremental currents. Branches 51, 52, 53 and 54 respectively include four series inductors $L_{11}-L_{14}$, three series inductor $L_{21}-L_{23}$, two series inductors $L_{31}$ and $L_{32}$, and one inductor $L_4$. All of the inductors have like values, whereby the DC currents flowing in branches 51, 52, 53 and 54 are respectively $I_2/4$, $I_2/3$, $I_2/2$, and $I_2$. The inductors of branches 51-54 can be charged simultaneously by DC power supply 11, as illustrated in FIG. 6. Alternatively, if the current supplying capability of DC source 11 is not adequate to simultaneously supply all of branches 51-54 with current, the branches can be charged at different times by utilizing a multi-bus arrangement and a separate switch for each branch, or by grouping the branches together. After the inductors of each branch have been charged the inductors of that particular branch are short circuited to maintain a circulating current in the inductor equal to the initially supplied charging current.

Figure 7:
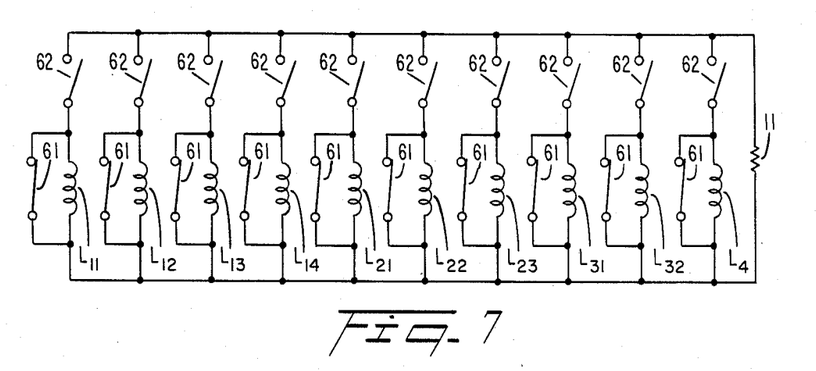
FIG. 7 is a circuit diagram of the apparatus illustrated in FIG. 6, wherein some of the switches of FIG. 5 are activated so circulating charging currents are supplied in parallel to a load.

After all of the branches have been charged and prior to any of the inductors being connected to load 11, the inductors in the circuit of FIG. 6 are switched into the circuit arrangement illustrated in FIG. 7. FIG. 7 includes a separate branch for each of inductors $L_{11}-L_{14}$, $L_{21}-L_{23}$, $L_{31}$, $L_{32}$ and $L_4$. Each branch includes a closed switch 61 shunting the inductor of the particular branch and an open switch 62 in series with the inductor terminals. When it is desired to supply the current circulating in a particular inductor to load 11, switch 61 shunting the particular inductor is open circuited, followed immediately by closure of switch 62. If, for example, it is desired to supply a programmed current waveform to load 11 that sequentially has the values $I_2$, $1.5I_2$, $2I_2$, $I_2/3$, and $1.7I_2$, the shunt switches 61 and series switches 62 of the branches containing the following inductors are activated, in the named sequence, to the open and closed states: the branch containing inductor $L_4$ supplies a current magnitude $I_2$, the branches containing inductors $L_4$ and $L_{32}$ respectively supply current magnitudes $I_2$ and $I_2/2$, the branches containing inductors $L_4$, $L_{32}$ and $L_{31}$ respectively supply current magnitudes $I_2$, $I_2/2$ and $I_2/2$, the branch containing inductor $L_{21}$ supplies current magnitude $I_2/3$ and the branches containing inductors $L_4$, $L_{31}$, and $L_{11}$ respectively supply current magnitudes $I_2$, $I_2/2$ and $I_2/5$.

Figure 5:
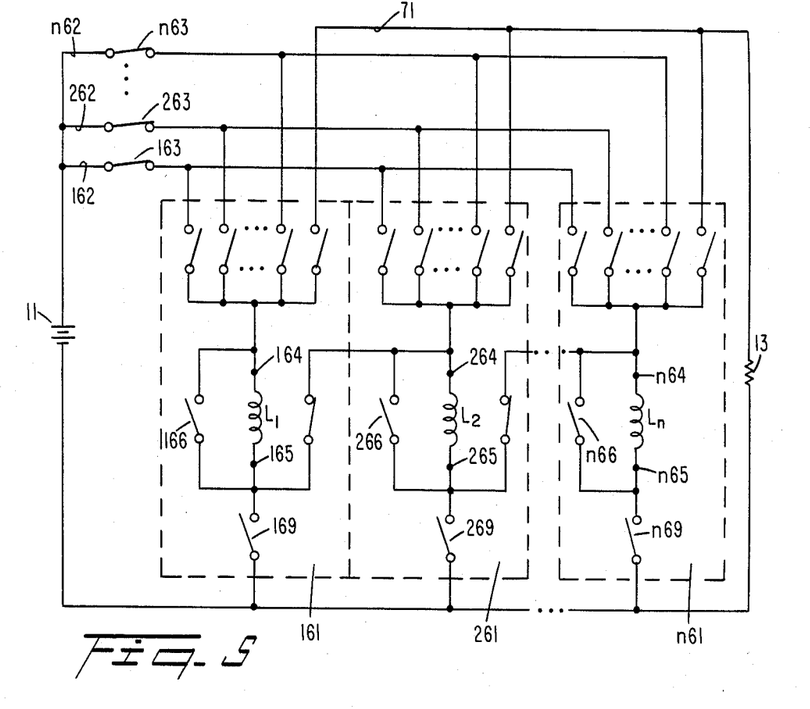
FIG. 5 is a circuit diagram of a third generalized embodiment of the invention.

A circuit for achieving the connections illustrated in FIGS. 6 and 7, as well as other generalized charging connections for inductors having the same values, is illustrated in FIG. 5, which includes n identical modules 161, 261 ... n61, each including one inductor selectively connected in different parallel and series circuits to be charged by DC power supply 11 by microprocessor 15 appropriately activating switches included in each module. The circuit of FIG. 5 can be arranged to provide a single branch containing n series inductors to be charged by supply 11, n parallel branches each charged separately by supply 11 and variations of these parallel and series circuit combinations. The n inductors of FIG. 5 are connected under the control of microprocessor 15 in parallel with each other in any desired sequence and timing, with any desired numbers of inductors being simultaneously connected to supply current to load 13 to synthesize waveshapes as desired.

To these ends, the circuit illustrated in FIG. 5 includes n inductors $L_p$, of which inductors $L_1, L_2 \ldots L_n$ are illustrated. Inductors $L_1, L_2 \ldots L_{(n-1)}$ are included in (n−1) identical modules 161, 261 ... (n−1)61; the last module n61 is slightly different from the remaining modules p61, where p is selectively every integer from 1 to (n−1).

Modules p61 and n61 are connected to the electrodes of DC source 11 by way of buses 162, 262 ... n62, each of which includes a selectively opened and closed series switch 163, 263 ... n63. During charging of inductors $L_p$, at least one of switches 163, 263 ... n63 is closed. How many of switches 163, 263 ... n63 are closed at any particular time is determined by the current supplying capability of DC power supply 11 and the values of inductors $L_p$. A further factor in determining the number of switches 163, 263 and n63 to be closed at any particular time is the number of parallel branch circuits which are to be charged by source 11. After one branch circuit has been charged, circulating currents are maintained in the inductors thereof, while a second branch is charged.

After inductors $L_p$ have been charged, the charged inductors are connected to load 13. During the discharge cycle while inductors $L_p$ are connected to load 13, only parallel branches, each including a single inductor $L_p$, are connected to load 13. One or more such parallel branches are connected to load 13 at any particular time. The different inductors are connected to load 13 for different time intervals, with the number of parallel inductors connected to the load differing during different ones of the periods, to synthesize a stepped waveform across load 13.

Figure 5A:
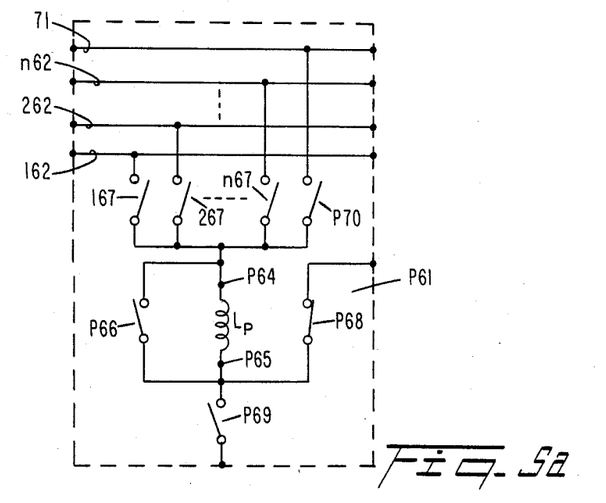
FIG. 5a is a circuit diagram of one module or section of the device illustrated in FIG. 5.

Reference is now made to FIG. 5a of the drawing wherein details of a typical module p61 are illustrated. Module p61 includes inductor $L_p$, having opposed end terminals p64 and p65, selectively shunted by switch p66. Terminal p64 is connected to bus conductors 162, 262 ... n62 by switches 167, 267 ... n67, respectively.

To enable several inductors $L_p$ to be simultaneously charged, these several inductors are connected in series with each other in a single branch circuit, and terminal p65 is connected to terminal (p+1)64 of the following module by way of switch p68. To enable inductors $L_p$ of the several modules to be selectively connected in parallel to supply current to load 13, terminal p65 is selectively connected to a common terminal for the negative electrode of DC supply 11 and load 13 by way of switch p69. In addition, terminal p64 is connected to the remaining terminal of load 13 by way of selectively closed switch p70 and bus 71.

The last module n61 is the same as modules 161, 261 ... (n−1)61, except that there is no need to include a connection from terminal n65 to the succeeding module, whereby switch p68, FIG. 5a, is excluded from module n61.

In operation, during a charging cycle, switches 163, 263 ... n63 as well as switches 167, 267 ... n67 are closed to establish the required current magnitudes in inductors $L_1, L_2 \ldots L_n$. Switches p68 and p69 control the number of inductors in each branch. For example, if three inductors $L_1, L_2$ and $L_3$ (inductor $L_3$ is not shown) are to be charged with the same current magnitude, inductors $L_1, L_2$ and $L_3$ are connected to form a single branch by closing switches 168, 268 and 368 and opening switches 169 and 269. Simultaneously, switches 167-n67 of modules 261 and 361 are closed, as are switches 267-n67 of module 161. During the charging cycles, switches p66 and n66 are opened.

After inductors $L_1, L_2 \ldots L_n$ are charged as desired by control of switches 163, 263 ... n63, as well as switches 167-n67 of modules 161-n61, the currents supplied to the inductors during the charging cycle circulate in short circuits established by closing switches p66 and n66. Simultaneously, all other switches in the system are open circuited, whereby only circulating currents equal in magnitude to the charging current for the particular inductor flows.

To synthesize a waveform as desired, switches p66 are open circuited, followed immediately thereafter by closure of switches p69 and p70 to provide a discharge path from inductor $L_p$ to load 13. All other switches in the circuit remain open circuited during the discharge cycle, to establish the connections illustrated in FIG. 7.

Figure 8:
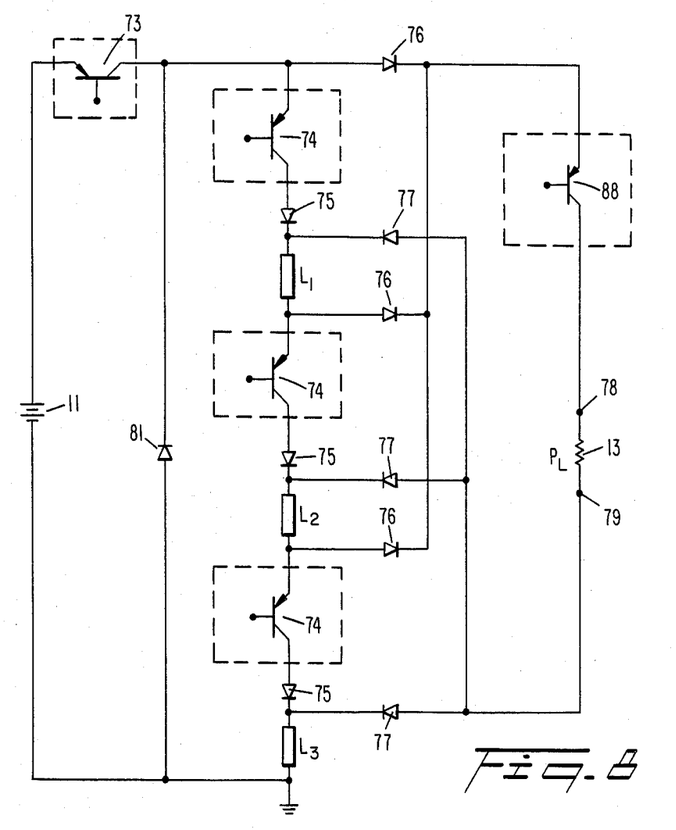
FIG. 8 is a circuit diagram of a practical solid state embodiment of the device illustrated in FIGS. 2a–2c.

Reference is now made to FIG. 8 of the drawing, a circuit diagram of a practical implementation of the device illustrated in FIG. 1, wherein n=3. In FIG. 8, switch 12, FIG. 1, is replaced by pnp transistor 73, while each of switches 130, 230 and n30 is replaced by a series circuit including pnp transistor 74 and diode 75. Diode 75 is polarized so that current flows through it in the same direction that current flows between the emitter and collector of transistor 74. Voltage responsive switches 140, 240 and 340 (specified as switch n40 in FIG. 1) are diodes 76 connected to the emitters of transistors 74, while switches 150, 250 and 350 are diodes 77, connected to the cathodes of diodes 75. Diodes 76 are connected so that the anodes thereof are connected to the emitters of transistors 74, while the cathodes of diodes 76 are connected to terminal 78 of load 13 via the emitter collector path of pnp transistor 88. Diodes 77 have cathodes connected to a common terminal formed by the cathodes of diodes 75 and one terminal of inductors $L_1$, $L_2$ and $L_3$ and anodes connected to load terminal 79.

To provide the circulating current through the branch including inductors $L_1$, $L_2$ and $L_3$, the branch is shunted by diode 81, having a cathode connected to a common terminal for the collector of transistor 73 and the emitter of transistor 74. The anode of diode 81 is connected to the grounded negative electrode of power supply 11, having a positive electrode connected to the emitter of transistor 73.

Because the emitters and collectors of transistors 73, 74 and 88 are floating, it is necessary to supply isolated control signals to them. To this end, opto-electronic techniques are utilized to control the biases of transistors 73, 74 and 88, as illustrated in the circuit diagram of FIG. 9. The same types of drive circuits are employed to control conduction of each of transistors 73, 74 and 88, whereby a description of FIG. 9 for transistor 73 suffices for the remaining transistors. In particular, forward and reverse biases are applied to the base of transistor 73 in response to optical energy emitted by light emitting diode 82, optically coupled to the base of transistor 73 to control the emitter collector conductivity thereof. Transistor 83 has an emitter collector path shunting the base collector junction of transistor 73. The emitter of transistor 83 is connected by resistor 84 to the emitter of transistor 73 and to the base of transistor 73 by way of resistor 85. The emitter of transistor 83 is connected to the collector of transistor 73 by way of resistor 86.

Figure 9:
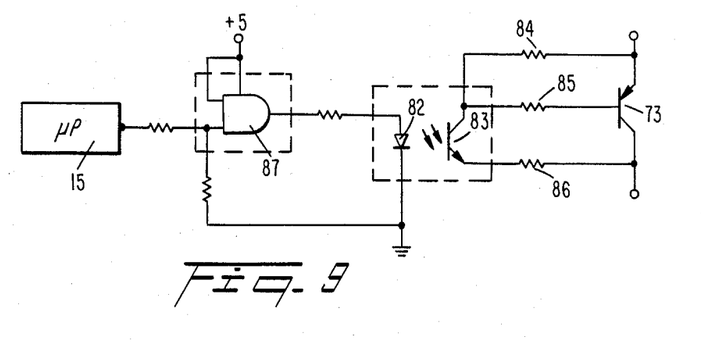
FIG. 9 is a circuit diagram of a controller for the transistorized switching elements in the circuit of FIG. 8.

Light emitting diode 82 is forward biased into a light emitting state in response to microprocessor 15 supplying a binary one level to gate 87, which functions as a driver for diode 82. When diode 82 emits light, transistor 83 is forward biased, in turn forward biasing transistor 73. Conversely, in response to microprocessor 15 deriving a binary zero output, no light is emitted by diode 82, causing transistor 83 to be back biased, whereby a high impedance state subsists between the emitter and collector of transistor 73.

Initially, while transistors 73 and 74 are forward biased in response to microprocessor 15 supplying binary one levels to the driver gates 87 associated with the transistors, inductors $L_1$, $L_2$ and $L_3$ are charged, whereby current flows from the emitter to the collector of each of the transistors and from the anode to the cathode of each of diodes 75. To prevent current from flowing through voltage responsive diodes 76 and 77 to load 13 during the charging cycle, transistor 88 is activated to an opened state in response to a signal derived by microprocessor 15 in a manner described in connection with FIG. 9. Diode 81 is back biased because of the positive voltage applied to the cathode thereof during the charging cycle.

When inductors $L_1$, $L_2$ and $L_3$ have been charged, microprocessor 15 causes transistors 73 and 88 to be respectively back and forward biased. In response to transistor 73 being back biased, circulating current from inductors $L_1$, $L_2$ and $L_3$ flows through each of transistors 74 and diodes 75, to forward bias diode 81 and establish a circulating current path. Diodes 76 and 77 remain back biased at this time because the voltage at the emitter of the transistor 74, connected to the junction of the cathode of diode 81 and the anode of diode 76, has a lower voltage than the voltage at the common terminal of diodes 75 and 77 which is connected to the ungrounded terminal of inductor $L_3$.

To couple the current flowing in inductor $L_1$ to load 13, microprocessor 15 supplies a binary zero level to the driver gate 87 for the transistor 74 associated with inductor $L_1$. This causes the emitter collector path of transistor 74 associated with inductor $L_1$ to become back biased, whereby the voltage between the emitter of transistor 74 and the cathode of transistor 75 associated with inductor $L_1$ is positive. At this time, the emitter collector path of transistor 88 is forward biased, whereby current flows from the anodes to the cathodes of diodes 76 and 77 associated with inductor $L_1$, as described in connection with FIG. 2a. In a similar manner, the emitter collector paths of transistors 74 associated with inductors $L_2$ and $L_3$ are selectively back biased, causing the circuit of FIG. 8 to sequentially assume the conditions illustrated in FIGS. 2b and 2c.

Figure 10:
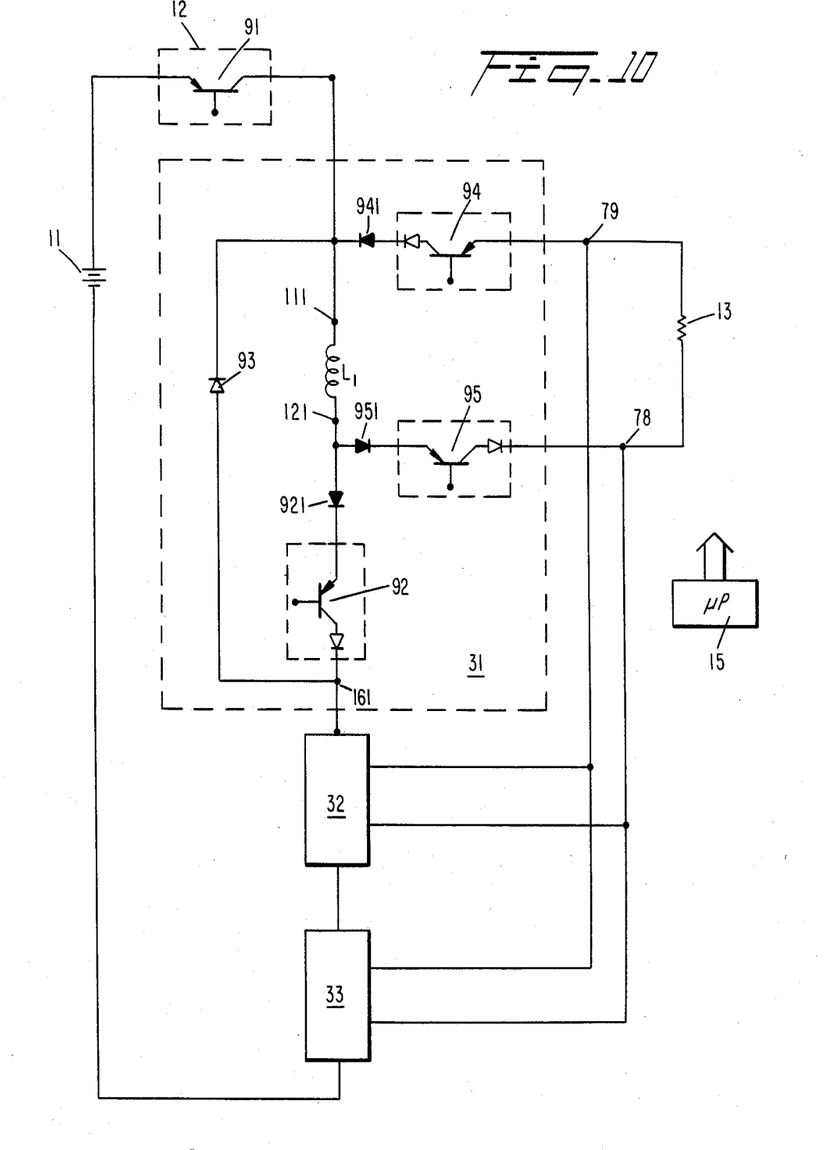
FIG. 10 is a circuit diagram of a solid state embodiment of the device illustrated in FIGS. 4a–4c.

Reference is now made to FIG. 10 of the drawing wherein there is illustrated a solid-state version of the apparatus illustrated in FIGS. 3 and 3a In FIG. 10 are illustrated modules 31, 32 and 33, series connected with each other, across DC power supply 11 and the emitter collector path of pnp transistor 91. Transistor 91 is selectively forward and back biased in response to the output of microprocessor 15 by optical signals, in the same manner as described in connection with forward and back biasing of transistor 73, FIG. 9.

Each of modules 31, 32 and 33 contains a practical implementation of the ideal components described supra in reference to FIG. 3A. In FIG. 10 the components of module 31 are illustrated in detail. The same arrangement of components is present in modules 32 and 33. In the following description, the subscript k is understood to refer to the corresponding component in FIG. 3A, and is replaced by 1 in FIG. 10. The switch k31 of each module is formed of pnp transistor 92 and diode 921. Diode 921 is connected between terminal k21 of inductor $L_k$ and the emitter of transistor 92, and polarized so that current flows through it in the same direction that current flows between the emitter and collector of transistor 92. The inductor $L_k$, the diode 921 and the emitter collector path of transistor 92 are connected in a series combination shunted by diode 93, having an anode connected to the collector of transistor 92 and a cathode connected to terminal k11 of the inductor $L_k$. Diode 951 and transistor 95 are connected in series and polarized to allow positive current to flow from terminal k21 of inductor $L_k$ to terminal 78 of load 13. Diode 941 and transistor 94 are connected in series and polarized to allow positive current to flow from terminal 79 of load 13 to terminal k11 of inductor $L_k$. Diodes 921, 941 and 951 are included and polarized to prevent sneak emitter collector currents while the emitter collector paths of transistors 92, 94 and 95 are respectively back biased by negative voltages at the bases thereof. Transistor 91 does not need such a diode because the positive terminal of source 11 maintains the emitter of this transistor at a reference, non-floating potential, in contrast to the floating conditions for the electrodes of transistors 92, 94 and 95. By command of the microprocessor, each of transistors 91, 92, 93 and 94 either allows current to flow in the direction in which they are polarized or the transistors interrupt such current to maintain an open circuit condition. In the inductor $L_k$, this flow is in the same direction that the current flows during the charging cycle.

In operation, the emitter collector paths of transistors 91 and 92 are simultaneously forward biased and the emitter collector paths of transistors 94 and 95 are back biased during charging of inductors $L_k$ by DC source 11. Diodes 93 are thereby back biased in response to the voltage at terminal k11 being greater than the voltage at the collector of transistor 92 of each module. When inductors $L_k$ have been appropriately charged, the emitter collector path of transistor 91 is open circuited, while the emitter collector paths of transistors 92 of modules 31, 32 and 33 remain closed. Thereby the voltage at the collector of transistor 92 of each module is now greater than the voltage at terminal k11 of module k. This causes each of diodes 93 to be forward biased so a separate circulating current flows through diode 93 and inductor $L_k$ of each module.

When it is desired to supply the current flowing in inductor $L_k$ to load 13, the emitter collector path of transistor 92 associated with inductor $L_k$ is open circuited, followed immediately by closing the emitter collector paths of transistors 94 and 95 in response to output signals of microprocessor 15. The circulating current flowing in inductor $L_k$ is then transferred to load 13 by way of the emitter collector paths of transistors 94 and 95, as described supra in connection with FIG. 4a. Similarly, the circulating currents in modules $L_2$ and $L_3$ are selectively and sequentially transferred to load 13, as described in connection with FIGS. 4b and 4c.

Figure 11:
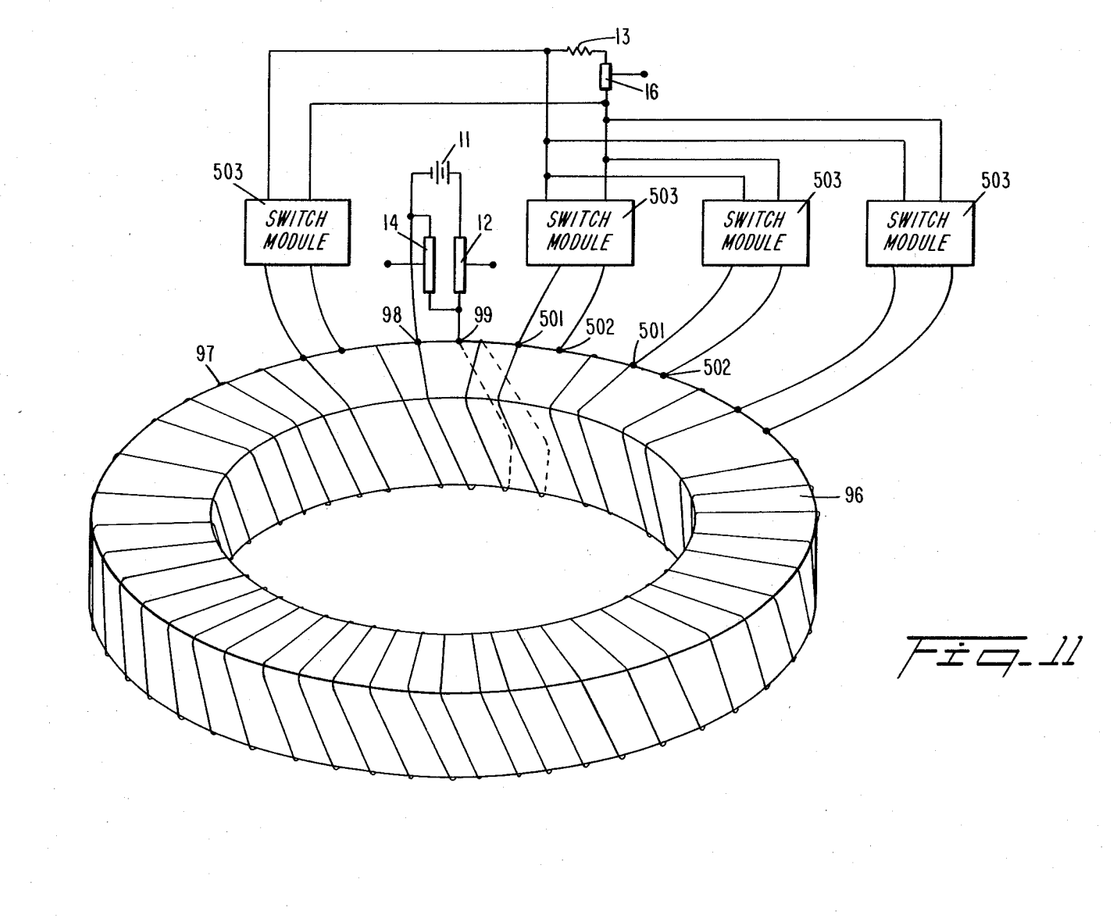
FIG. 11 is a schematic diagram of a toroidal core including plural inductors connected together by switch modules similar to those illustrated in connection with FIGS. 1–5.

In many instances, it is desired to magnetically couple the several inductors to each other, to provide greater efficiency in storing energy and transferring the stored energy to the load. The magnetic energy of the different inductors is coupled to the inductors by winding them on a common toroidal core 96, as illustrated in FIG. 11. Core 96 can be made of a magnetic material having high permeability, e.g. iron, or of a material having low magnetic permeability, e.g. nylon. Multiturn winding 97 is wound continuously in the same direction on toroidal core 96. Opposite end terminals 98 and 99 of winding 97 are connected to DC power supply 11 and switch 12, and are shunted by switch 14. At equally spaced intervals between terminals 98 and 99 are terminals 501 and 502 that are connected to switch modules 503, which can be configured as illustrated in any of FIGS. 1, 3, 8 or 10. To simplify the drawing of FIG. 11, only four switch modules and the terminals 501 and 502 therefor are illustrated, but it is to be understood that a relatively large number of switch modules is provided. Each of switch modules 503 is connected to load 11, as described in connection with any of FIGS. 1-4, 8 and 10.

While there have been described and illustrated several specific embodiments of the invention, it will be clear that variations in the details of the embodiments specifically illustrated and described may be made without departing from the true spirit and scope of the invention as defined in the appended claims.

We claim:

1. A pulse forming network responsive to a DC power supply for supplying predetermined current waveforms to a load in response to commands from a programmed controller comprising a plurality of inductors $L_1, L_2 \ldots L_n$, where n is an integer greater than 1, switch means responsive to commands from the programmed controller for (a) coupling inductor $L_k$ to the DC source and to the load so that inductor $L_k$ is charged by the DC source to a predetermined current level that is maintained substantially constant, where k is selectively every value between 1 and n, and (b) supplying approximately the predetermined current level in each inductor to the load so that during successive intervals the predetermined approximately constant current levels from differing numbers of said inductors flow from the inductors to the load; the inductance of each inductor, the impedance of the load, and the duration that current is supplied to the load by the inductors being such that the predetermined current level supplied by each inductor to the load is maintained substantially constant.

2. The network of claim 1 wherein the switch means includes means responsive to the commands for isolating the inductors from the DC source while the inductors supply current to the load.

3. The network of claim 2 wherein the switch means includes means responsive to the commands for isolating the inductors from the load while the inductors are coupled to the DC source.

4. The network of claim 1 wherein the switch means includes means responsive to the commands for connecting a plurality of the inductors in series circuit with each other and the DC supply while the inductors are being charged so all of the inductors in the series circuit are charged with and maintain the same approximate current $I_1$.

5. The network of claim 1 wherein the switch means includes means responsive to the commands for connecting a plurality of branches to the source, different ones of the branches including differing numbers of the inductors in series circuit with each other and the DC supply while the inductors are being charged so all of the inductors in each series circuit are charged with and maintain the same approximate current $I_k$ for each branch k.

6. The network of claim 4 wherein the switch means includes means responsive to the commands for connecting said inductors charged with and maintained approximately at current $I_1$ in different numbers of parallel circuits with the load.

7. The network of claim 5 wherein the switch means includes means responsive to the commands for connecting said inductors charged with and maintained approximately at currents $I_k$ in different numbers of parallel circuits with the load.

8. The network of claim 1 wherein the inductors are magnetically coupled together.

9. The network of claim 8 wherein the inductors are mounted on a common toroid to provide the magnetic coupling therebetween.

10. The network of claim 9 wherein the toroid is a magnetic material having a relatively high magnetic permeability.

11. The network of claim 9 wherein the toroid is a material having a relatively low magnetic permeability.

12. The network of claim 8 wherein magnetic core means magnetically couples a plurality of the inductors together.

13. The network of claim 12 wherein the charging current magnitude is sufficient to saturate the core means.

14. The network of claim 12 wherein the charging current magnitude is insufficient to saturate the magnetic core means.

15. The network of claim 1 wherein the switch means includes a separate switch element $S_k$ connected in series with each individual inductor $L_k$, each separate switch element $S_k$ being changed between open and closed states as a result of one of the commands as current is initially supplied by the individual inductor $L_k$ to the load.

16. The network of claim 15 wherein each separate switch element $S_k$ is responsive to said one command to be open circuited as current is initially supplied by each individual inductor $L_k$ to the load.

17. The network of claim 16 wherein each separate switch element $S_k$ includes: a control terminal responsive to a bi-level signal derived in response to one of the commands and a path that is selectively opened and closed in response to the magnitude of the signal applied to the control terminal; the path being connected in series with each individual inductor $L_k$.

18. The network of claim 16 wherein the switch means includes switching means $S_{ak}$ connected to supply current from inductor $L_k$ to the load while switch element $S_k$ is open circuited.

19. The network of claim 16 wherein the switch means includes: switching means $S_{ak}$ connected to inductor $L_k$ to supply current from inductor $L_k$ to the load, and a further separate switch $S_{sk}$ connected across the series combination of inductor $L_k$ and switching means $S_{ak}$, each further separate switch $S_{sk}$ being closed between the time inductor $L_k$ is charged until switch element $S_{ak}$ is open and the switching means $S_{ak}$ is closed to supply current to the load.

20. The network of claim 19 wherein: switching means $S_{ak}$ includes: (a) a first voltage responsive switch device $S_{1k}$ having first and second electrodes, the first electrode being connected to a first terminal of inductor $L_k$ and the switch element associated with inductor $L_k$, the second electrode being connected to a first terminal of the load, and (b) a second voltage response switch device $S_{2k}$ having third and fourth electrodes, the third electrode being connected to a second terminal of inductor $L_k$ and the switch element associated therewith, the fourth electrode being connected to a second terminal of the load.

21. The network of claim 20 wherein the first and second switch devices $S_{1k}$ and $S_{2k}$ are opened and closed as a function of the magnitude and polarity of the voltages between the first and second electrodes thereof.

22. The network of claim 1 wherein the switch means includes means responsive to the commands for establishing a plurality of branch circuits across the DC supply while the inductors are being charged, each of the branch circuits including at least one of the inductors, different ones of the branch circuits being charged with different currents by the DC supply.

23. The network of claim 22 wherein at least some of said branch circuits include a plurality of said inductors connected in series with each other so all of said inductors of each particular branch circuit are charged with the same current.

24. The network of claim 23 wherein the switch means includes means for connecting each charged inductor to the load in a separate parallel circuit.

25. The network of claim 1 wherein the inductance of each inductor, the impedance of the load, and the duration that current is supplied to the load by the inductors are such that the predetermined current level supplied by each inductor to the load is maintained within about 0.7 of the magnitude of the current to which inductor $L_k$ is charged by the DC source.

26. A method of controlling current waveforms supplied to a load by a DC supply and plural inductors comprising the steps of coupling the inductors to the DC source and to the load so that each of the inductors is charged by the DC source to a predetermined current level, maintaining the current in each inductor substantially constant at the predetermined level to which it is charged, supplying the substantially constant predetermined current level in the inductors to the load so that during successive intervals the predetermined substantially constant current levels from differing numbers of said inductors flow from the inductors to the load.

27. The method of claim 26 further comprising the step of controlling the durations that the substantially constant currents are supplied to the load.

28. The method of claim 26 wherein different inductors are charged to different current levels.

29. The method of claim 26 wherein the inductance of each inductor, the impedance of the load, and the duration that current is supplied to the load by the inductors are such that the predetermined current level supplied by each inductor to the load is maintained within about 0.7 of the magnitude of the current to which each inductor is charged by the DC source.

* * * * *